United States Patent
Jeon

(10) Patent No.: US 10,026,793 B2
(45) Date of Patent: Jul. 17, 2018

(54) ORGANIC LIGHT EMITTING DIODE DISPLAY

(71) Applicant: Samsung Display Co., Ltd., Yongin-si (KR)

(72) Inventor: Hee Chul Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 260 days.

(21) Appl. No.: 14/944,686

(22) Filed: Nov. 18, 2015

(65) Prior Publication Data

US 2016/0307971 A1    Oct. 20, 2016

(30) Foreign Application Priority Data

Apr. 16, 2015   (KR) ........................ 10-2015-0053924

(51) Int. Cl.

| | |
|---|---|
| *H01L 29/08* | (2006.01) |
| *H01L 51/00* | (2006.01) |
| *H01L 23/58* | (2006.01) |
| *H01L 29/10* | (2006.01) |
| *H01L 29/18* | (2006.01) |
| *H01L 33/00* | (2010.01) |
| *H01L 21/66* | (2006.01) |
| *G06F 3/041* | (2006.01) |
| *H01L 27/32* | (2006.01) |
| *G09G 3/00* | (2006.01) |
| *H01L 51/52* | (2006.01) |

(52) U.S. Cl.
CPC ......... *H01L 27/3258* (2013.01); *G09G 3/006* (2013.01); *H01L 22/30* (2013.01); *H01L 51/5246* (2013.01); *H01L 51/5253* (2013.01); *G09G 2330/12* (2013.01); *H01L 27/323* (2013.01)

(58) Field of Classification Search
CPC ......... H01L 22/30; H01L 22/32; H01L 22/34; H01L 27/3225; H01L 27/323; H01L 27/3258; H01L 51/5253; H01L 51/5246; G09G 3/006; G09G 2330/12
USPC ...... 257/40, 48, 88; 438/15, 18, 28; 345/173
See application file for complete search history.

(56) References Cited

U.S. PATENT DOCUMENTS

| | | | |
|---|---|---|---|
| 5,196,799 A | 3/1993 | Beard et al. | |
| 2010/0134426 A1* | 6/2010 | Lee | ........................ G06F 3/0412 345/173 |
| 2016/0293884 A1* | 10/2016 | Zhang | ................ H05B 33/0896 |

\* cited by examiner

*Primary Examiner* — Fernando L Toledo
*Assistant Examiner* — Aaron Gray
(74) *Attorney, Agent, or Firm* — H.C. Park & Associates, PLC

(57) ABSTRACT

An organic light emitting diode display including a substrate includes a display area and a peripheral area surrounding the display area, an organic light emitting member disposed in the display area, dams disposed in the peripheral area, a thin film encapsulation layer covering a portion of a first dam among the dams and the organic light emitting member, a touch sensing member disposed on the thin film encapsulation layer of the display area, and a first crack sensing member disposed at a position corresponding to the first dam.

11 Claims, 5 Drawing Sheets

ORGANIC LIGHT EMITTING DIODE DISPLAY

CROSS-REFERENCE TO RELATED APPLICATION

This application claims priority from and the benefit of Korean Patent Application No. 10-2015-0053924 filed on Apr. 16, 2015, which is hereby incorporated by reference for all purposes as if fully set forth herein.

BACKGROUND

Field

Exemplary embodiments relate to an organic light emitting diode display.

Discussion of the Background

An organic light emitting diode display includes two electrodes, an organic emission layer positioned therebetween, and an organic light emitting member including a pixel circuit to drive them. Electrons injected from a cathode that is one of the electrodes and holes injected from an anode that is the other electrode are bonded to each other in the organic light emission layer to form excitons, and light is emitted while the excitons discharge energy.

The organic light emitting member of the organic light emitting diode display typically needs to be protected through a process encapsulating the organic light emitting member. The organic light emitting member may be encapsulated by a glass substrate and a sealant or a thin film encapsulation (TFE) layer in which at least one organic layer and an at least one inorganic layer are alternately deposited.

The organic layer may be formed by a solution process among layers forming the thin film encapsulation layer, and may be an organic material having flexibility before hardening. As such, it may overflow out of the display area in the case of over coating. To prevent of the overflow of the organic material, at least one dam is formed near the display area.

However, when a crack is generated in the dam during the manufacturing process of the organic light emitting diode display, the organic material overflows into the peripheral area through the crack such that a failure ratio of the organic light emitting diode display may increase.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting diode display that minimizes the failure ratio by completely detecting cracks generated in the dam.

Additional aspects will be set forth in the detailed description which follows, and, in part, will be apparent from the disclosure, or may be learned by practice of the inventive concept.

An exemplary embodiment discloses an organic light emitting diode display including a substrate comprising a display area and a peripheral area surrounding the display area, an organic light emitting member disposed in the display area, dams disposed in the peripheral area, a thin film encapsulation layer covering a portion of a first dam among the dams and the organic light emitting member, a touch sensing member disposed on the thin film encapsulation layer of the display area, and a first crack sensing member disposed at a position corresponding to the first dam.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
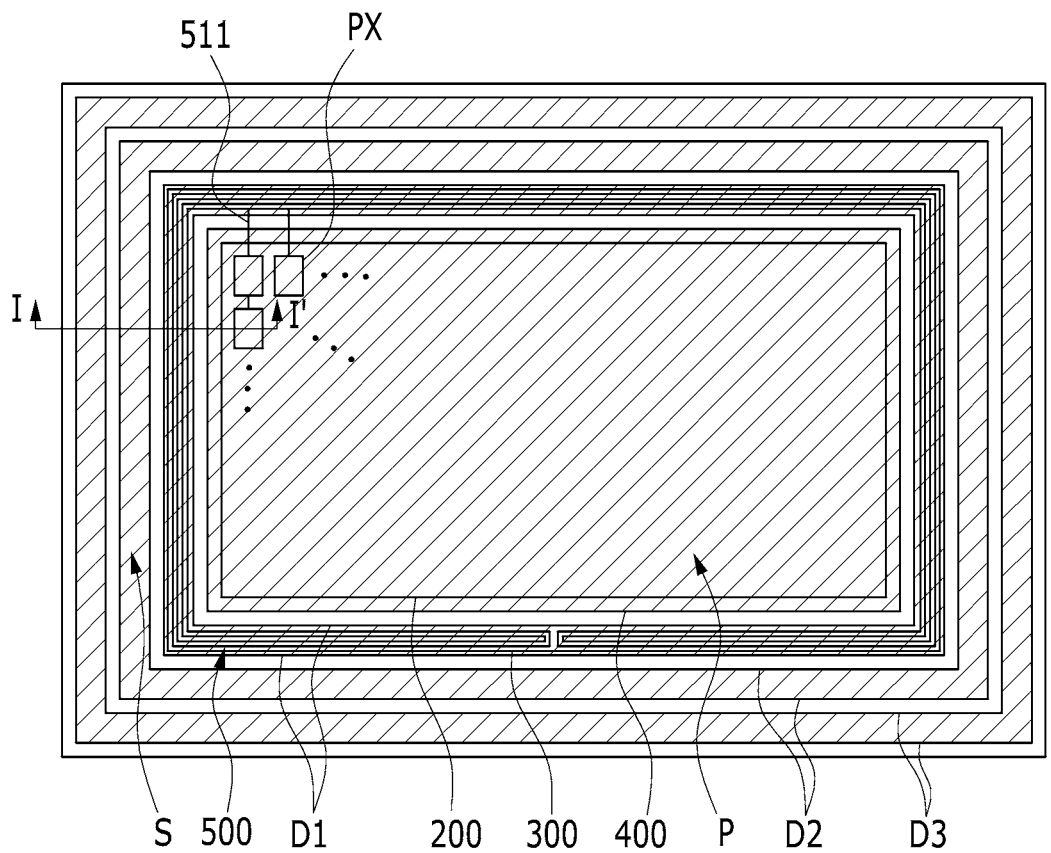
FIG. 1 is a schematic top plan view of a display area and a peripheral area of an organic light emitting diode display according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

In the accompanying drawings, an active matrix (AM) type of organic light emitting diode (OLED) display is illustrated to have a 2Tr-1Cap structure in which two transistors (TFTs) and one capacitor are provided for one pixel. However, the present disclosure is not limited to such a structure. Thus, in the organic light emitting diode display, each pixel may be provided with a plurality of transistors and at least one capacitor, and may be formed to have various structures by further forming additional wires or omitting existing wires. In this case, the pixel is a minimum unit for displaying an image, and the organic light emitting diode display displays the image through a plurality of pixels.

Now, an organic light emitting diode display according to an exemplary embodiment will be described with reference to FIGS. 1, 2, 3, and FIG. 4.

Figure 2:
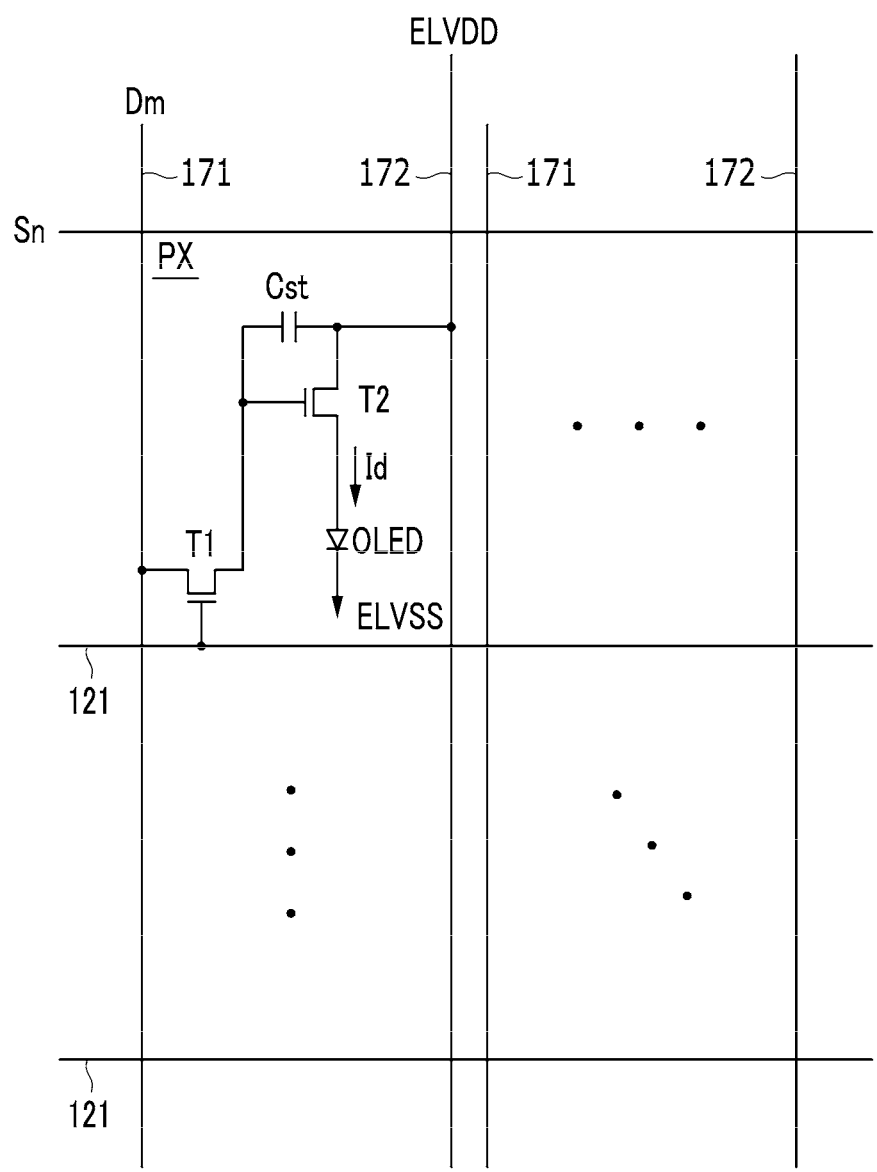
FIG. 2 is an equivalent circuit diagram of an organic light emitting member of an organic light emitting diode display according to an exemplary embodiment.
Figure 3:
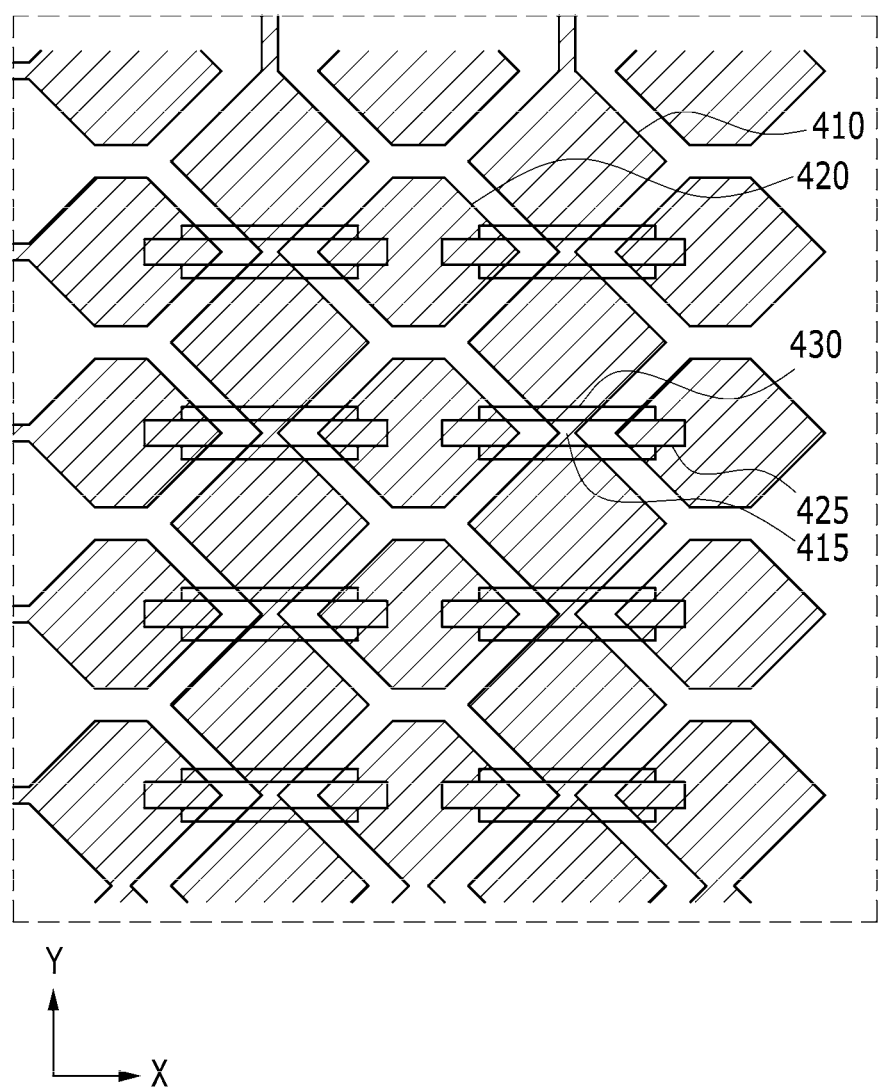
FIG. 3 is a partial enlarged top plan view of a touch sensing member of an organic light emitting diode display according to an exemplary embodiment.
Figure 4:
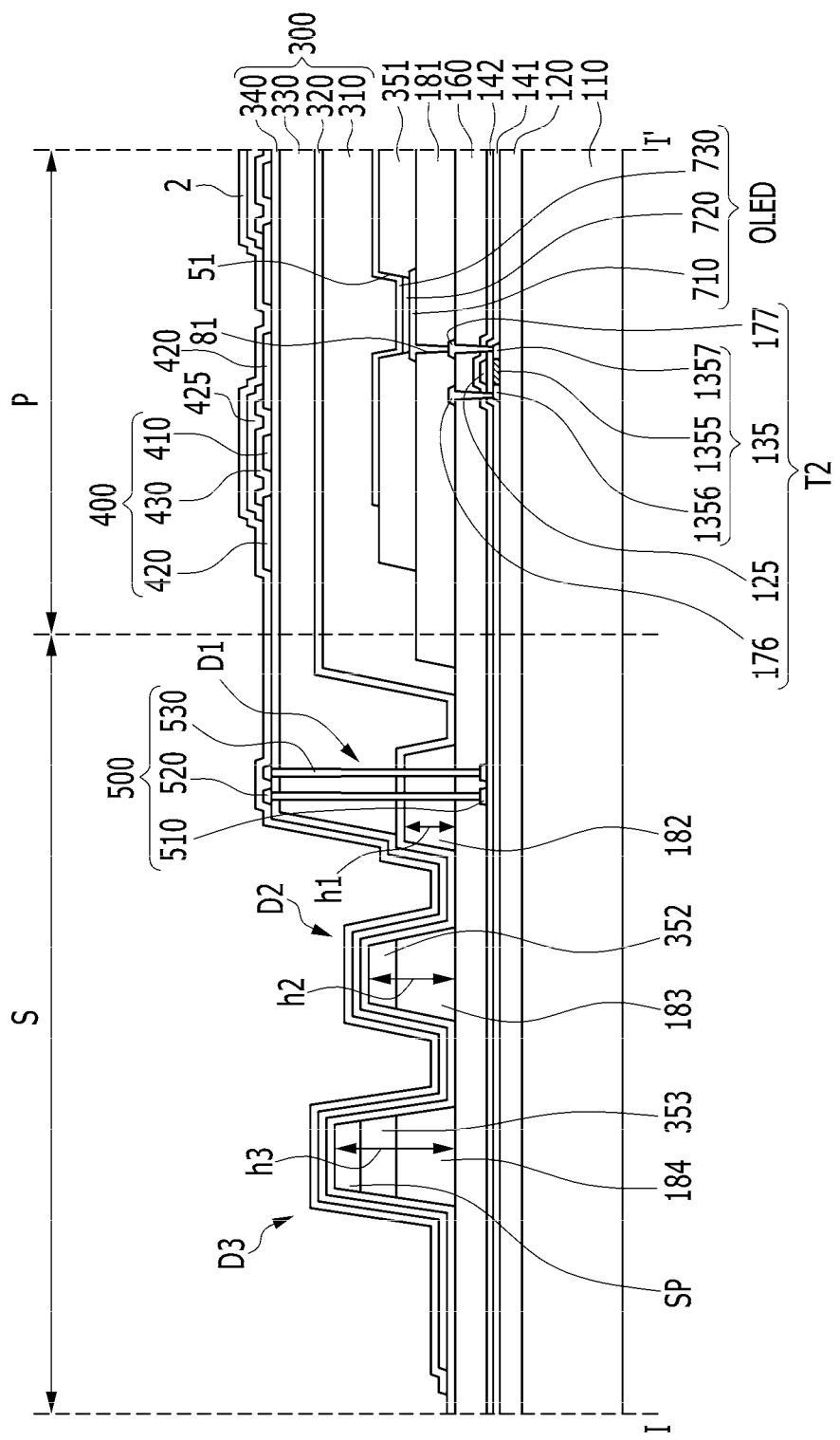
FIG. 4 is a cross-sectional view taken along cross-sectional line I-I' of FIG. 1.

FIG. 1 is a schematic top plan view of a display area and a peripheral area of an organic light emitting diode display according to an exemplary embodiment. FIG. 2 is an equivalent circuit diagram of an organic light emitting member of an organic light emitting diode display according to an exemplary embodiment. FIG. 3 is a partial enlarged top plan view of a touch sensing member of an organic light emitting diode display according to an exemplary embodiment. FIG. 4 is a cross-sectional view taken along cross-sectional line I-I' of FIG. 1.

As illustrated in FIG. 1, an organic light emitting diode display according to an exemplary embodiment includes a substrate 110 (not shown) including a display area P and a peripheral area S enclosing the display area P, an organic light emitting member 200 including a plurality of pixels PX formed in the display area P of the substrate 110, a plurality of dams D1, D2, and D3 formed in the peripheral area S of the substrate 110, a thin film encapsulation layer 300 covering the organic light emitting member 200 and a first dam D1 among a plurality of dams, a touch sensing member 400 formed on the thin film encapsulation layer 300 of the display area P, and a first crack sensing member 500 formed at a position corresponding to the first dam D1.

As shown in FIG. 2, the organic light emitting member 200 includes a plurality of signal lines 121, 171, and 172, and a plurality of pixels PX arranged in a matrix and connected to the plurality of signal lines.

The signal lines 121, 171, and 172 include a plurality of scan lines 121 transmitting a scan signal Sn, a plurality of data lines 171 crossing the scan lines 121 and transmitting a data signal Dm, and a plurality of driving voltage lines 172 transmitting a driving voltage ELVDD. The scan lines 121 substantially extend in a row direction and are nearly parallel to each other. The data lines 171 and the driving voltage lines 172 substantially extend in a column direction and are nearly parallel to each other.

Each pixel PX includes a plurality of transistors T1 and T2 respectively connected to the plurality of signal lines 121, 171, and 172, a storage capacitor, Cst, and an organic light emitting diode (OLED).

The transistors T1 and T2 comprise a switching transistor T1 connected to the data line 171 and a driving transistor T2 connected to the organic light emitting diode (OLED).

The switching thin film transistor T1 includes a control terminal, an input terminal, and an output terminal. The control terminal of the switching thin film transistor T1 is connected to the scan line 121, the input terminal is connected to the data line 171, and the output terminal is connected to the driving thin film transistor T2. The switching thin film transistor T1 transmits a data signal Dm applied to the data line 171 to the driving thin film transistor T2 in response to a scan signal applied to the scan line 121.

The driving thin film transistor T2 also includes a control terminal, an input terminal, and an output terminal. The control terminal of the driving thin film transistor T2 is connected to the switching thin film transistor T1, the input terminal is connected to the driving voltage line 172, and the output terminal is connected to the organic light emitting diode OLED. The magnitude of an output current Id flowing from the driving thin film transistor T2 varies according to a voltage applied between the control terminal and the output terminal.

The storage capacitor Cst is connected between the control terminal and the input terminal of the driving thin film transistor T2. The storage capacitor Cst charges a data signal applied to the control terminal of the driving thin film transistor T2 and maintains charging of the data signal after the switching thin film transistor T1 is turned off.

The organic light emitting diode OLED includes an anode connected to the output terminal of the driving thin film transistor T2, a cathode connected to a common voltage ELVSS, and an organic light emitting member formed between the anode and the cathode. The organic light emitting diode OLED displays an image by emitting light with different intensities according to the output current Id of the driving thin film transistor T2.

The switching thin film transistor T1 and the driving thin film transistor T2 may be n-channel field effect transistors (FETs) or p-channel FETs. In addition, a connection iii relationship between the thin film transistors T1 and T2, the storage capacitor Cst, and the organic light emitting diode OLED can be changed.

Referring back to FIG. 1, the first dam D1, among the plurality of dams, is positioned closest to the pixel PX. The first dam D1 encloses the plurality of pixels PX. The second dam D2 is separated from the first dam D1 and encloses the first dam D1. The third dam D3 is separated from the second dam D2 and encloses the second dam D2. The first dam D1, the second dam D2, and the third dam D3 are formed in the peripheral area to prevent the overflow of the organic material forming the thin film encapsulation layer 300.

In the present exemplary embodiment, three dams are formed (i.e., the first, second, and third dams). However exemplary embodiments are not limited to only three dams. It is envisioned that an organic light emitting diode display may include any number of dams (i.e., one or four or more dams), if necessary.

As shown in FIG. 3, the touch sensing member 400 includes a first touch electrode 410 formed in a first direction Y transmitting a first touch signal. The touch sensing member 400 also includes second touch electrodes 420 formed in a second direction X crossing the first direction and transmitting a second touch signal.

The first touch electrode 410 includes rhombus shaped electrode patterns that are connected to each other in a vertical direction of the first direction and that correspond to an Rx electrode (receiver electrode) transmitted with a first touch signal sensing an X-axis coordinate value. This first touch electrode 410 has a first touch overlapping portion 415 connecting the rhombus shaped electrodes to each other.

The second touch electrodes 420 are separated from each other. Each second touch electrode 420 has a hexagon or a rhombus shaped electrode pattern. A connection line 425, connecting the adjacent second touch electrodes 420 to each other, is formed between adjacent second touch electrodes 420. The second touch electrodes 420 correspond to a Tx wiring (transmitter electrode) transmitted with a second touch signal sensing a Y-axis coordinate value. A touch insulating member 430 is formed on the first touch overlapping portion 415 of the first touch electrode 410. The touch insulating member 430 is formed between the first touch electrode 410 and the connection line 425 to insulate the first touch electrode 410 and the second touch electrode 420.

The first touch electrode 410, the second touch electrode 420, and the connection line 425 are formed of a transparent conductive oxide such as ITO (Indium Tin Oxide), IZO (Indium Zinc Oxide), ZnO (zinc oxide), or $In_2O_3$(Indium Oxide), or silver nano wire (AgNW).

The first touch electrode 410 and the second touch electrode 420 sense the coordinates by the touch of a user and have a function of transmitting the coordinates to the external driving circuit to be converted into an electrical signal.

A detailed structure of the organic light emitting diode display according to the exemplary embodiment shown in FIG. 1 will be described in further detail with reference to FIGS. 1, 3, and 4. The driving transistor will mainly be described. The switching transistor is the same as most of the deposition structure of the driving transistor so the redundant portions will be omitted for brevity.

Figure 5:
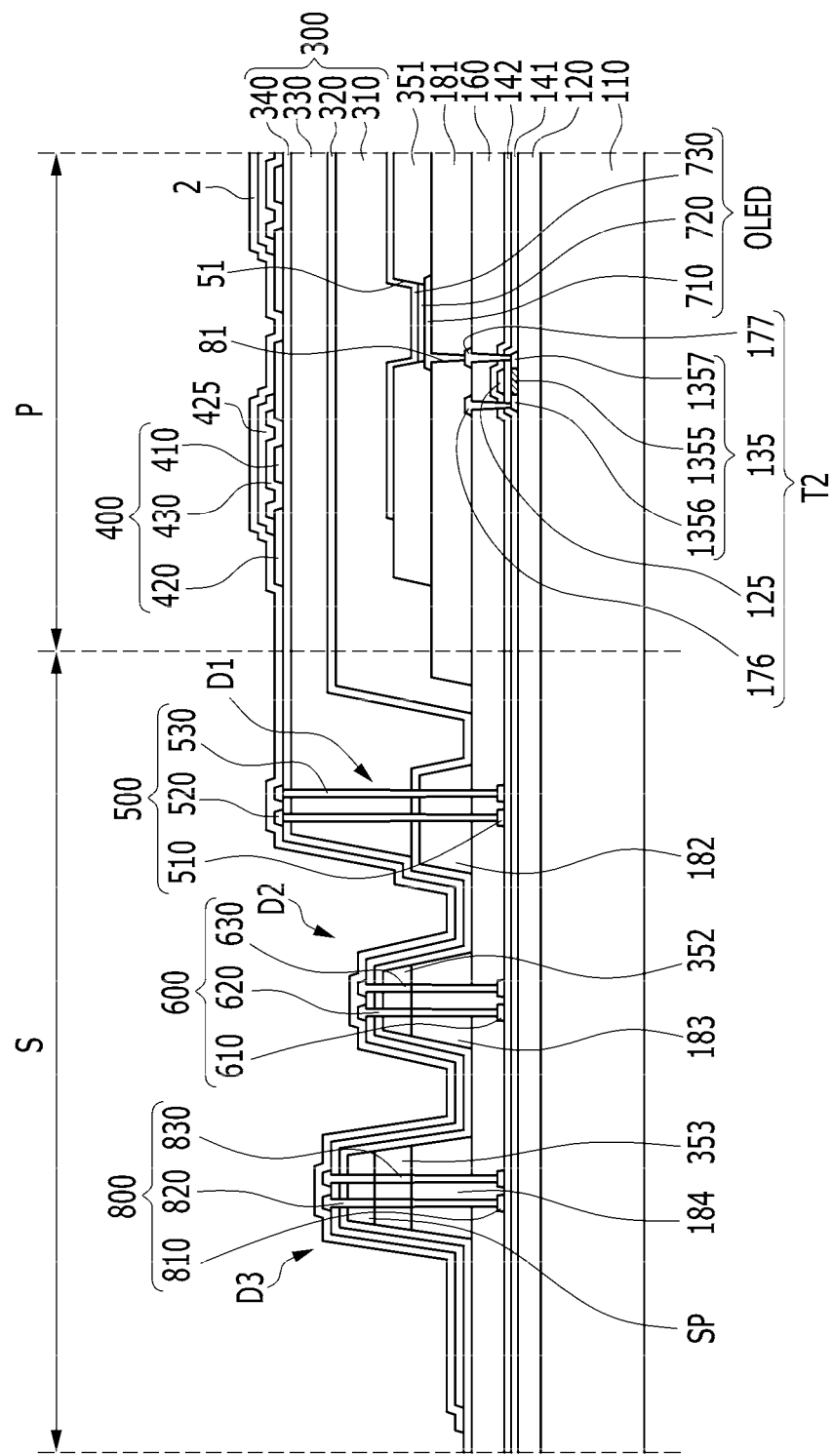
FIG. 5 is a cross-sectional view of a display area and a peripheral area of an organic light emitting diode display according to another exemplary embodiment.

As shown in FIGS. 1, 3, and 5, a buffer layer 120 is formed on a substrate 110. The substrate 110 may be formed of an insulating material such as glass, crystal, ceramic, or plastic. The buffer layer 120 serves to block impurities from the substrate 110 in order to improve characteristics of polysilicon at the time of the crystallization process for forming polysilicon. The buffer layer 120 also servers to planarize the substrate 110 in order to mitigate stress of the semiconductor formed on the buffer layer 120. The buffer layer 120 may be made of silicon nitride ($SiN_x$), silicon oxide $SiO_2$, or the like.

A semiconductor 135 is formed on the buffer layer 120 of the display area P. The semiconductor 135 may be formed of polycrystalline silicon or an oxide semiconductor. The oxide semiconductor may include any one of titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as an indium-gallium-zinc oxide ($InGaZnO_4$), indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O). When the semiconductor 135 is formed of an oxide semiconductor, a separate passivation layer may be added in order to protect the oxide semiconductor. The oxide semiconductor maybe vulnerable to an external environment, such as a high temperature environment.

The semiconductor 135 is divided into a channel 1355, a source region 1356, and a drain region 1357. The source region 1356 and the drain region 1357 are formed at both sides of the channel 1355. The channel 1355 of the semiconductor 135 is channel-doped with a doping impurity, such as an N-type impurity or a P-type impurity. The source region 1356 and the drain region 1357 of the semiconductor 135 contact doping regions that have a doping concentration of a doping impurity larger than that of the doping impurity of the channel-doping.

A first gate insulating layer 141 for covering the semiconductor 135 is formed on the semiconductor 135. The first gate insulating layer 141 may be formed of a silicon nitride ($SiN_x$) or a silicon oxide ($SiO_2$).

A gate electrode 125 is formed on the first gate insulating layer 141. The gate electrode 125 is a part of the scan line 121 (FIG. 2) and overlaps the channel 1355.

A second gate insulating layer 142 for covering the gate electrode 125 is formed on the gate electrode 125. The second gate insulating layer 142 may be made of silicon nitride ($SiN_x$), silicon oxide ($SiO_2$), or the like.

A first lower crack sensing line 510 is formed on the second gate insulating layer 142 of the peripheral area S. The first lower crack sensing line 510 is positioned under the first dam D1 and encloses the display area P as shown in FIGS. 1 and 4. To prevent a voltage drop, two wirings forming the first lower crack sensing line 510 are separated from each other, with an outer line reversing back on itself to form an inner line. The two wirings surround the entire display area P.

When a crack is generated in the first dam D1, the damage is also applied to the first lower crack sensing line 510. Accordingly, the resistance of the sensing connection line 511 is connected to the first lower crack sensing line 510, and thus the pixel PX connected to the sensing connection line 511 does not realize color normally. Through the defective color pixels, cracks generated in the peripheral area may be sensed.

In the present exemplary embodiment, the first lower crack sensing line 510 is formed on the second gate insulating layer 142. However exemplary embodiments are not limited to such an arrangement. Instead, exemplary embodiments may include the first lower crack sensing line 510 formed at various positions.

An interlayer insulating layer 160 is disposed to cover the first lower crack sensing line 510 in the peripheral area S and the second gate insulating layer 142 in both the peripheral area S and the display area P. The interlayer insulating layer 160 may be made of silicon nitride ($SiN_x$) or silicon oxide ($SiO_2$) like the first gate insulating layer 141 and the second gate insulating layer 142.

A source electrode 176 and a drain electrode 177 are formed on the interlayer insulating layer 160 of the display area P. The source electrode 176 and the drain electrode 177 are respectively connected to the source region 1356 and the drain region 1357. The semiconductor 135, the gate electrode 125, the source electrode 176, and the drain electrode 177 form a driving transistor T2.

A pixel passivation layer 181 covering the source electrode 176 and the drain electrode 177 is formed on the source electrode 176 and the drain electrode 177 of the display area P as well as the interlayer insulating layer 160.

Peripheral passivation layers 182, 183, and 184 covering the interlayer insulating layer 160 are formed on the interlayer insulating layer 160 of the peripheral area S. The peripheral passivation layers 182, 183, and 184 include a first peripheral passivation layer 182, a second peripheral passivation layer 183, and a third peripheral passivation layer 184 that are patterned to be separated from each other. The first peripheral passivation layer 182, the second peripheral passivation layer 183, and the third peripheral passivation layer 184 are sequentially formed farther from the display area P. The first peripheral passivation layer 182, the second peripheral passivation layer 183, and the third peripheral passivation layer 184 enclose the display area P. The first peripheral passivation layer 182 among the peripheral passivation layers 182, 183, and 184 is closest to the pixel PX and corresponds to the first dam D1.

A pixel electrode 710 made of a transparent conductor such as ITO or IZO is formed on the pixel passivation layer 181. The pixel electrode 710 is electrically connected to the drain electrode 177 of the driving transistor T2 through a contact hole 81 formed in the pixel passivation layer 181, thereby being an anode of the organic light emitting diode OLED.

A pixel partition 351 is formed on the pixel passivation layer 181 and an edge of the pixel electrode 710. The pixel partition 351 has a pixel opening 51 exposing the pixel electrode 710. The pixel partition 351 may be formed of a resin such as polyacrylates or polyimides, or a silica-based inorganic material.

A first peripheral partition 352 and a second peripheral partition 353 are respectively formed on the second peripheral passivation layer 183 and the third peripheral passivation layer 184 of the peripheral area S. The first peripheral partition 352 is formed of the same pattern as the second peripheral passivation layer 183. The second peripheral partition 353 is formed of the same pattern as the third peripheral passivation layer 184.

The second peripheral passivation layer 183 and the first peripheral partition 352 together form the second dam D2 such that a height h2 of the second dam D2 is higher than the height h1 of the first dam D1 made of only the first peripheral passivation layer 182. Accordingly, even if the organic material of the display area P flows over the first dam D1, the second dam D2 may prevent the overflow of the organic material.

An organic emission layer 720 is formed in the pixel opening 51 of the pixel partition 351. The organic emission layer 720 is formed of layers including at least one of a light emitting layer, a hole-injection layer (HIL), a hole-transporting layer (HTL), an electron-transporting layer (ETL), and an electron-injection layer (EIL). When the organic emission layer 720 includes all of the above, the hole injection layer is positioned on the pixel electrode 710 (i.e., the pixel electrode 710 acts as an anode), and the hole-transporting layer, the light emitting layer, the electron-transporting layer, and the electron-injection layer may be sequentially stacked on the hole injection layer.

A common electrode 730 is formed on the pixel partition 351 and the organic emission layer 720 of the display area P. The common electrode 730 becomes a cathode of the organic light emitting diode OLED. The pixel electrode 710, the organic emission layer 720, and the common electrode 730 together form an organic light emitting diode OLED.

A spacer SP is formed on the second peripheral partition 353. The spacer SP is formed of the same pattern as the second peripheral partition 353. The spacer SP may be formed of a stacked layer of an organic material such as polyacrylates resin, polyimides resin, or the like, or a stacked layer of an organic material and an inorganic material.

The third peripheral passivation layer 184, the second peripheral partition 353, and the spacer SP together form the third dam D3 such that the height h3 of the third dam D3 is higher than the height h2 of the second dam D2 made of the second peripheral passivation layer 183 and the first peripheral partition 352. Accordingly, even if the organic material of the display area P flows over the first dam D1 and the second dam D2, the third dam D3 may prevent the overflow of the organic material, thereby the organic material may be further prevented from overflowing into the peripheral area S.

A thin film encapsulation layer 300 is formed on the common electrode 730 of the display area P. The thin film encapsulation layer 300 includes a first organic layer 310, a first inorganic layer 320, a second organic layer 330, and a second inorganic layer 340 that are sequentially deposited.

The first organic layer 310 is a covering seal over the pixel passivation layer 181 and the pixel partition 351, and the first inorganic layer 320 is a covering seal over all of the first organic layer 310, the first dam D1, the second dam D2, and the third dam D3. The second organic layer 330 is formed by the upper first dam D1 while covering the first inorganic layer 320. Also, the second inorganic layer 340 is a covering seal over both the second organic layer 330 and the first inorganic layer 320.

In the present exemplary embodiment, the thin film encapsulation layer 300 is formed of four layers (i.e., the first organic layer 310, the first inorganic layer 320, the second organic layer 330, and the second inorganic layer 340). However exemplary embodiments are not limited to four layers in the thin film encapsulation layer 300. Instead, numerous variations are possible (e.g., two layers, three layers, and five layers).

A first touch electrode 410 and a second touch electrode 420 are formed on the thin film encapsulation layer 300 of the display area P. Also, a first upper crack sensing line 520 is formed on the thin film encapsulation layer 300 of the peripheral area S. The first upper crack sensing line 520 is formed at a position corresponding to the first dam D1 and encloses the display area P.

The first upper crack sensing line 520 may be formed of the same material as the first touch electrode 410 and the second touch electrode 420. To protect the first upper crack sensing line 520 and the touch sensing member 400 (i.e., first touch electrode 410, second touch electrode 420, connection line 425, and touch insulating member 430) from the outside, an overcoat 2 covering the first upper crack sensing line 520, the touch sensing member 400, and the thin film encapsulation layer 300 is formed thereon.

A first connecting member 530 is formed in the first peripheral passivation layer 182 and the overlying first inorganic layer 320, second organic layer 330, and second inorganic layer 340. The first connecting member 530 penetrates the first peripheral passivation layer 182, the first inorganic layer 320, the second organic layer 330, and the second inorganic layer 340. The first connecting member 530 connects the first lower crack sensing line 510 and the first upper crack sensing line 520 to each other.

The first lower crack sensing line 510, the first upper crack sensing line 520 and the first connecting member 530 form the first crack sensing member 500.

As described above, the first upper crack sensing line 520 formed at a position corresponding to the first dam D1 may detect a crack generated on the first dam D1, the first lower crack sensing line 510 may detect a crack generated under the first dam D1. The first connecting member 530 may detect a crack generated in the height direction of the first dam D1. Accordingly, since the first crack sensing member 500 may detect a crack generated on the entire region of the first dam D1, the overflow of the organic material generated in the manufacturing process may be more completely blocked.

On the other hand, in the exemplary embodiment, the first crack sensing member is only formed at the position corresponding to the first dam, but the second crack sensing member and the third crack sensing member may also be respectively formed at a position corresponding to the second dam and the third dam as another exemplary embodiment.

The organic light emitting diode display according to another exemplary embodiment will be described with reference to FIG. 5.

FIG. 5 is a cross-sectional view of a display area and a peripheral area of an organic light emitting diode display according to another exemplary embodiment.

The other exemplary embodiment shown in FIG. 5 is substantially the same as the exemplary embodiment shown in FIG. 1, FIG. 2, and FIG. 3, except for a second crack sensing member and a third crack sensing member that are further formed.

As shown in FIG. 5, in the organic light emitting diode display may include the second crack sensing member and the third crack sensing member are formed at positions respectively corresponding to the second dam and the third dam. Accordingly, a crack generated in the second dam and the third dam may be detected.

The second lower crack sensing line 610 and the third lower crack sensing line 810 are formed on the second gate insulating layer 142 of the peripheral area S. The second lower crack sensing line 610 is positioned under the second dam D2 and encloses the first lower crack sensing line 510. The third lower crack sensing line 810 is positioned under the third dam D3 and encloses the second lower crack sensing line 610. When a crack is generated in the second dam D2 and the third dam D3, the damage is also applied to the second lower crack sensing line 610 and the third lower crack sensing line 810, and thus the crack can be detected.

The interlayer insulating layer 160 covering the second lower crack sensing line 610 and the third lower crack sensing line 810 is formed on the second lower crack sensing line 610 and the third lower crack sensing line 810.

Also, the second upper crack sensing line 620 and the third upper crack sensing line 820 are formed on the thin film encapsulation layer 300 of the peripheral area S. The second upper crack sensing line 620 is formed at a position corresponding to the second dam D2, and the third upper crack sensing line 820 is formed at a position corresponding to the third dam D3. The second upper crack sensing line 620 and the third upper crack sensing line 820 may be formed of the same material as the first touch electrode 410 and the second touch electrode 420.

A second connecting member 630 is formed in the interlayer insulating layer 160, the second dam D2, the first inorganic layer 320, and the second inorganic layer 340. The second connecting member 630 penetrates the interlayer insulating layer 160, the second dam D2, the first inorganic layer 320, and the second inorganic layer 340 and connects the second lower crack sensing line 610 and the second upper crack sensing line 620 to each other. The second lower crack sensing line 610, the second upper crack sensing line 620, and the second connecting member 630 form the second crack sensing member 600.

As described above, the second lower crack sensing line 610 may detect a crack generated under the second dam D2, the second upper crack sensing line 620 may detect a crack generated on the second dam D2, and the second connecting member 630 may detect a crack generated in the height direction of the second dam D2. Accordingly, the second crack sensing member 600 may detect a crack generated in the entire region of the second dam D2 such that the overflow of the organic material generated in the manufacturing process may be more completely blocked.

Also, the third connecting member 830 is formed in the interlayer insulating layer 160, the third dam D3, the first inorganic layer 320, and the second inorganic layer 340. The third connecting member 830 penetrates the interlayer insulating layer 160, the third dam D3, the first inorganic layer 320, and the second inorganic layer 340, and it connects the third lower crack sensing line 810 and the third upper crack sensing line 820 to each other. The third lower crack sensing line 810, the third upper crack sensing line 820, and the third connecting member 830 form the third crack sensing member 800.

As described above, the third lower crack sensing line 810 may detect a crack generated under the third dam D3, the third upper crack sensing line 820 may detect a crack generated on the third dam D3, and the third connecting member 830 may detect a crack generated in the height direction of the third dam D3. Accordingly, the third crack sensing member 800 may detect a crack generated in the entire region of the third dam D3 such that the overflow of the organic material generated in the manufacturing process may be more completely blocked.

Thus, in the organic light emitting diode display according to an exemplary embodiment, by forming the first crack sensing member at a position corresponding to the first dam, a crack generated in the entire region of the first dam is detected such that the rate of overflow of the organic layer may be reduced.

Also, by forming the first upper crack preventing line in the same layer as the touch sensing member, the first crack sensing member detecting a crack in the entire first dam region may be formed without additional processes, such that the manufacturing cost and the manufacturing time may be reduced.

Additionally, by forming all crack preventing members in the region corresponding to the plurality of dams, the overflow of organic material may be detected more accurately.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements

What is claimed is:

1. An organic light emitting diode display, comprising:
    a substrate comprising a display area and a peripheral area surrounding the display area;
    an organic light emitting member disposed in the display area;
    dams disposed in the peripheral area;
    a thin film encapsulation layer covering a portion of a first dam among the dams and the organic light emitting member;
    a touch sensing member disposed on the thin film encapsulation layer of the display area; and
    a first crack sensing member disposed at a position corresponding to the first dam,
    wherein the first crack sensing member comprises:
    a first lower crack sensing line disposed under the first dam: and
    a first upper crack sensing line disposed on the thin film encapsulation layer of the peripheral area and disposed on the first dam.

2. The organic light emitting diode display of claim 1, wherein:
    the first dam among the dams is positioned to be closest to a pixel of the light emitting member, and the first dam surrounds the pixel.

3. The organic light emitting diode display of claim 1, wherein the first upper crack sensing line is disposed on the same layer as the touch sensing member.

4. The organic light emitting diode display of claim 3, wherein the organic light emitting member comprises:
    a semiconductor disposed on the substrate;
    a first gate insulating layer disposed on the semiconductor and the substrate;
    a gate electrode disposed on the first gate insulating layer;
    a second gate insulating layer disposed on the gate electrode and the first gate insulating layer;
    an interlayer insulating layer disposed on the second gate insulating layer;
    a source electrode and a drain electrode disposed on the interlayer insulating layer;
    a pixel passivation layer covering the source electrode and the drain electrode;
    a pixel partition disposed on the pixel passivation layer; and
    an organic light emitting diode connected to the drain electrode,
    wherein the first lower crack sensing line is disposed between the second gate insulating layer and the interlayer insulating layer.

5. The organic light emitting diode display of claim 4, further comprising:
    a first connecting member connecting the first lower crack sensing line and the first upper crack sensing line to each other.

6. The organic light emitting diode display of claim 4, wherein:
    the first dam comprises a first peripheral passivation layer that is separated from the pixel passivation layer and is disposed on the same layer as the pixel passivation layer, and
    a portion of the thin film encapsulation layer is disposed on the first peripheral passivation layer.

7. The organic light emitting diode display of claim 6, wherein the first connecting member penetrates the first peripheral passivation layer and the thin film encapsulation layer.

8. The organic light emitting diode display of claim 6, further comprising:
    a second dam separated from the first dam and enclosing the first dam; and
    a third dam separated from the second dam and enclosing the second dam,
    wherein the second dam comprises a second peripheral passivation layer disposed on the same layer as the first peripheral passivation layer and a first peripheral partition formed on the second peripheral passivation layer, and
    the third dam comprises a third peripheral passivation layer disposed on the same layer as the first peripheral passivation layer, a second peripheral partition disposed on the third peripheral passivation layer, and a spacer disposed on the second peripheral partition.

9. The organic light emitting diode display of claim 8, further comprising:
   a second crack sensing member formed at a position corresponding to the second dam; and
   a third crack sensing member formed at a position corresponding to the third dam.

10. The organic light emitting diode display of claim 9, wherein:
   the second crack sensing member comprises:
      a second lower crack sensing line disposed on the same layer as the first lower crack sensing line,
      a second upper crack sensing line disposed on the second peripheral partition, and
      a second connecting member connecting the second lower crack sensing line and the second upper crack sensing line to each other, and
   the third crack sensing member comprises:
      a third lower crack sensing line disposed on the same layer as the first lower crack sensing line,
      a third upper crack sensing line disposed on the spacer, and
      a third connecting member connecting the third lower crack sensing line and the third upper crack sensing line to each other.

11. The organic light emitting diode display of claim 10, wherein:
   the second connecting member penetrates the second peripheral passivation layer and the second peripheral partition, and
   the third connecting member penetrates the third peripheral passivation layer, the third peripheral partition, and the spacer.

* * * * *